Figure 1:
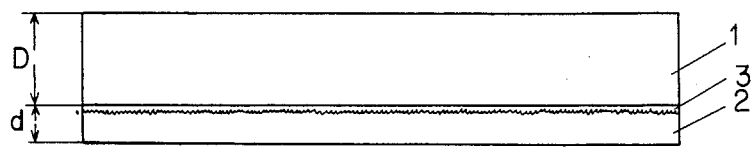

United States Patent [19]

Gobrecht

[11] Patent Number: 4,568,586
[45] Date of Patent: Feb. 4, 1986

[54] CERAMIC/METAL ELEMENT

[75] Inventor: Jens Gobrecht, Gebenstorf, Switzerland

[73] Assignee: BBC Brown, Boveri & Company Limited, Baden, Switzerland

[21] Appl. No.: 640,814

[22] Filed: Aug. 15, 1984

[30] Foreign Application Priority Data

Aug. 23, 1983 [CH] Switzerland ............... 4581/83

[51] Int. Cl.$^4$ ............................................. B32B 3/14
[52] U.S. Cl. ............................ 428/49; 228/122; 228/903; 403/271; 29/829
[58] Field of Search .......... 428/615, 620, 49, 552, 428/601, 67, 209, 210; 29/829, 830; 357/81; 148/33.4; 228/903, 123, 122, 188; 403/271

[56] References Cited

U.S. PATENT DOCUMENTS

| | | | |
|---|---|---|---|
| 3,128,419 | 4/1964 | Waldkotter et al. | 357/81 |
| 3,993,411 | 11/1976 | Babcock et al. | 403/271 |
| 3,994,430 | 11/1976 | Cusano et al. | 228/122 |
| 4,152,175 | 5/1979 | Burgess et al. | 136/89 PC |

Primary Examiner—John E. Kittle
Assistant Examiner—Thomas C. Saitta
Attorney, Agent, or Firm—Oblon, Fisher, Spivak, McClelland & Maier

[57] ABSTRACT

A ceramic/metal element, in which a metal layer (1) is firmly bonded to a ceramic substrate (2) after cooling and consequent solidification of a previously liquid eutectic interlayer (3), wherein the metal layer (1) has at least approximately the same or a greater thickness (D) than the ceramic substrate (2) and is composed in the manner of a mosaic from individual, predominantly loosely adjoining metal elements (1). By using the composite structure of the present ceramic/metal element, fracture of the ceramic substrate and curvature of the composite ceramic/metal element is avoided.

13 Claims, 6 Drawing Figures

CERAMIC/METAL ELEMENT

The invention relates to a ceramic/metal element according to the preamble of claim 1.

Such a ceramic/metal element, produced by the so-called "direct-bonding" process, is known, for example, from an article by A. Neidig in BBC-Nachrichten (1982), No. 7, pages 196 to 200. In that case, it is used for constructing hybrid-integrated power semiconductor components in standardised compact housings. In this application, the ceramic substrate is provided, on its side facing away from the metal layer, with conductor tracks. Active semiconductor elements, such as thyristors or diodes, as well as plug connectors are fitted to the conductor tracks. The waste heat generated in the active semiconductor elements during operation is removed through the ceramic substrate and the metal layer to a cooling body, on which the ceramic/metal element is placed in a plane relationship. The metal layer is here intended to provide good heat contact between the ceramic substrate and the cooling body.

In the known semiconductor component, the thickness of the metal layer is considerably smaller than the thickness of the ceramic substrate and corresponds approximately to the thickness of the conductor tracks. To improve the heat removal from the active semiconductor elements to the cooling body, and hence to improve the thermal rating of the active semiconductor elements, it is desirable to make the metal layer thicker, even thicker than the ceramic substrate. The latter should here be as thin as possible. This is not possible by conventional techniques. As shown in an article by M. Widmer et al. in "Journal of the American Ceramic Society" Vol. 56, No. 3, 1982, pages 149–153, the result of the high bonding temperature (of about 1070° C. for Cu as the metal and $Al_2O_3$ as the ceramic), required in the direct-bonding process, and of the different coefficients of thermal expansion of the two materials metal and ceramic is, after cooling from the bonding temperature to the ambient temperature, a curvature, increasing with the thickness of the metal layer, of the ceramic/metal element in the manner of a bimetallic curvature. If the thickness of the metal layer exceeds the thickness of the ceramic substrate, fracture of the ceramic substrate must be expected.

It is therefore the object of the invention to provide a ceramic/metal element of the type mentioned at the outset, in which the metal layer has at least approximately the same or a greater thickness than the ceramic substrate. At the same time, the ceramic substrate must not fracture during the cooling of the ceramic/metal element from the bonding temperature to ambient temperature, and the ceramic/metal element must not have a curvature after cooling. According to the invention, this object is achieved by the features of claim 1.

The solution according to the invention thus comprises a structuring of the metal layer, in particular by its mosaic-like construction from many small metal elements, the lateral dimensions of which correspond approximately to the thickness of the metal layer. As a result—by a certain redistribution of the tensile stresses in the metal layer to produce shear stresses—fracture of the ceramic substrate and curvature of the complete ceramic/metal element are avoided in an advantageous manner. For the use of the ceramic/metal element for constructing hybrid-integrated power semiconductor components, the structuring of the metal layer does not represent a disadvantage, since the waste heat has to be removed in the metal layer only perpendicular to the layer plane, and lateral thermal conductivity, that is to say conductivity in the plane of the metal layer, is unnecessary.

Figure 2:
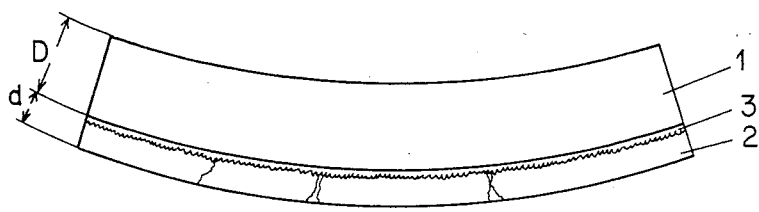
Figure 3:
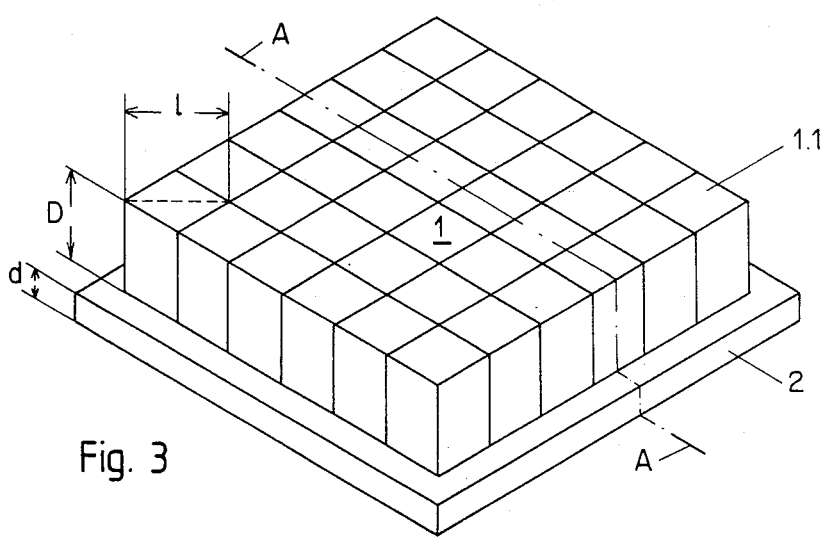
Figure 4:
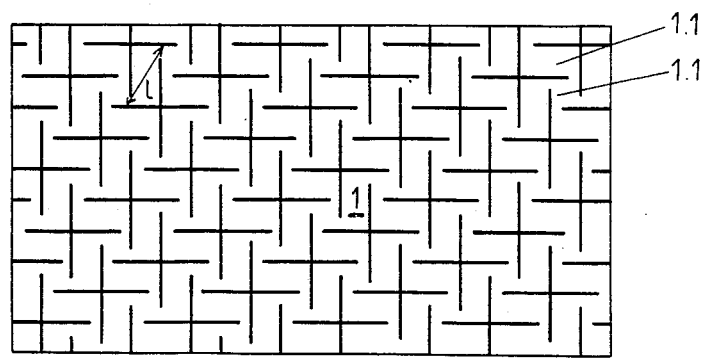
Figure 5:
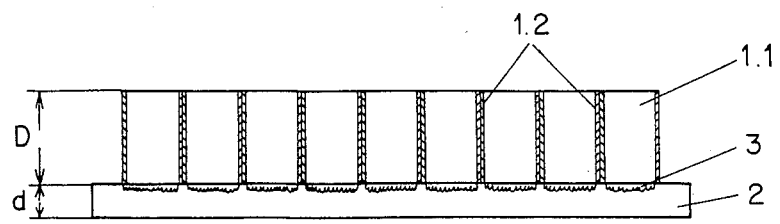
Figure 6:
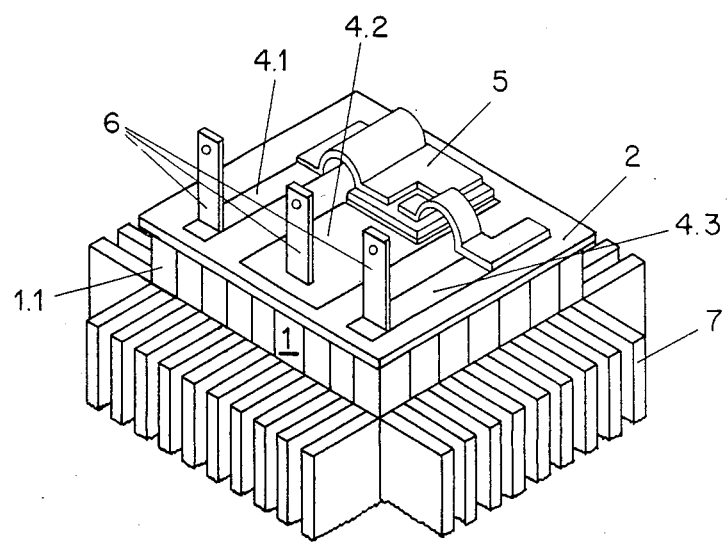

Further advantages and features of the invention, such as are also characterised in the sub-claims, are evident from the description which follows of an illustrative embodiment, reference being made to the attached drawings in which:

FIG. 1 shows, in section, a ceramic/metal element with an unstructured metal layer at the bonding temperature, FIG. 2 shows, likewise in section, the ceramic/metal element according to FIG. 1 after cooling to ambient temperature, FIG. 3 shows, in a perspective representation, a ceramic/metal element according to the invention with a structured metal layer, already cooled to ambient temperature, FIG. 4 shows a plan view of a metal layer which has been structured by punched-in slots, FIG. 5 shows the ceramic/metal element according to FIG. 3 in a section along A—A, with an illustration of a coating on the metal elements of the metal layer, and FIG. 6 shows, in a perspective representation, the ceramic/metal element according to FIGS. 3 and 4, which is constructed as a hybrid-integrated power semiconductor component and is placed on a cooling body.

In the figures, identical parts are marked by identical reference numerals.

In FIG. 1, a ceramic/metal element with a metal layer 1 and a ceramic substrate 2 is shown in section. The metal layer 1 is continuous and unstructured. The metal of the metal layer 1 is preferably Cu, and the ceramic is $AL_2O_3$, but metals other than Al and other oxide ceramics, such as, for example, BeO, AlN or SiC, can also be used. At least on the side facing the ceramic substrate 2, the metal layer 1 has a superficial oxide layer 3 which, when Cu is used for the metal layer 1, is a Cu0 layer. The ceramic/metal element according to FIG. 1 should have a temperature, already termed the bonding temperature above—about 1070° C. for $AL_2O_3$ and Cu. The bonding temperature should be above that temperature at which a liquid eutectic forms between the oxide layer 3 and a part of the pure metal of the metal layer 1—about 1060° C. for Cu0 and Cu. The eutectic is the initially mentioned liquid, eutectic interlayer. On the other hand, the bonding temperature must not be higher than the melting point of the pure metal of the metal layer 1—1083° C. for Cu. The liquid eutectic interlayer between the metal layer 1 and the ceramic substrate 2 has the property of wetting the surface of the ceramic substrate 2 and even penetrating into very fine pores of the ceramic substrate 2. When the ceramic/metal element is cooled to the melting point of the eutectic interlayer, the latter solidifies and forms a firm bond between the metal layer 1 and the ceramic substrate 2. On further cooling of the ceramic/metal element, finally down to ambient temperature, that is to say to about 20° C., high tensile stresses arise in both the metal layer 1 and the ceramic substrate 2, due to the widely different coefficients of thermal expansion of the metal and the ceramic. These stresses entail at least a permanent curvature, increasing with the thickness of the metal layer 1, of the ceramic/metal element or even lead to fracture of the ceramic, in particular if the thickness of the metal layer 1 exceeds the thickness of the ceramic substrate 2. In the figures, the thickness of the metal layer 1 is marked by D, and the thickness of the ceramic substrate 2 is marked by d.

In FIG. 2, the ceramic/metal element according to FIG. 1 is shown, after it has been cooled to ambient temperature, with a pronounced curvature and with cracks in the ceramic substrate 2.

FIG. 3 shows, in perspective illustration, a ceramic/metal element according to the invention with a structured metal layer 1. The metal layer 1 is composed in the manner of a mosaic from many individual metal elements 1.1. At least predominantly, the metal elements 1.1 are not firmly bonded mutually, but loosely adjoin one another. The ceramic/metal element according to the invention is already at ambient temperature. Due to the structuring of the metal layer 1, a conversion of tensile stresses into shear stresses in the metal layer 1 is obtained, whereby a curvature of the ceramic/metal element or fracture of the ceramic substrate 2 on cooling from the bonding temperature to ambient temperature is reliably avoided. The metal elements 1.1 can in principle have any desired shapes, as long as they can be fitted together in the manner of a mosaic to give a more or less closed metal layer 1. Suitable shapes for the metal elements 1.1 are in particular cuboid or hexagonal rods. It is to be regarded as equivalent to a mosaic-like construction of the metal layer 1 from individual elements, when a homogeneous metal layer 1 is structured by punched-in slots or holes made in them, so that the individual elements still cohere via metal bridges.

FIG. 4 shows a plan view of a metal layer 1 structured in this way by punched-in, mutually crossing slots. The essential point in the structuring of the metal layer 1 or its mosaic-like construction is that the greatest linear dimension of the metal elements 1.1 in the layer plane, marked 1 in FIGS. 3 and 4, is smaller, or at least not substantially greater, than twice the thickness D of the metal layer 1. Preferably, the greatest linear dimension 1 of the metal elements 1.1 is approximately equal to its thickness D. Sufficiently large tensile stresses for causing a curvature of the ceramic/metal element or fracture of the ceramic substrate 2 cannot then build up in the metal elements 1.1.

Without special treatment, the metal elements 1.1 are provided with an oxide layer not only on their side facing the ceramic substrate 2 but on their entire surface. At the bonding temperature, the metal elements 1.1 are then completely covered by a eutectic layer and can fuse together at their mutual contact surfaces and, after cooling, can form a firm bond between them. Such fusion can be prevented by a coating, marked by 1.2 in FIG. 5, applied to the mutual contact surfaces of the metal elements 1.1. The coating must have a melting point above the bonding temperature, and preferably even above the melting point of the metal of the metal elements 1.1. Examples of suitable materials for the coating 1.2 are Ni, Pd, Pt or Cr. The coating 1.2 can be applied by electroplating or by an electroless process, that is to say by simple dipping in an electrolyte.

FIG. 6 shows the ceramic/metal element according to FIG. 3 or FIG. 5 in a preferred use for the construction of a hybrid-integrated power semiconductor component. For this purpose, that side of the ceramic substrate 2 which faces away from the metal layer 1 is provided with conductor tracks 4.1, 4.2 and 4.3. The conductor tracks 4.1, 4.2 and 4.3 are metal foils which, like the metal layer 1, are firmly bonded to the ceramic substrate 2 after cooling and consequent solidification of a previously eutectic interlayer. An active semiconductor element 5, for example a thyristor, is fitted to the conductor track 4.2, with its anode pointing downwards. To compensate thermal stresses, a molybdenum disc can also be provided between the conductor track 4.2 and the thyristor 5. Contact bridges lead from the conductor track 4.1 to the cathode of the thyristor 5 and from the conductor track 4.3 to the ignition gate thereof. Moreover, plug connectors 6, to which a multipoint connector can be plugged for contacting the thyristor 5, are also soldered to the conductor tracks 4.1, 4.2 and 4.3. The conductor tracks 4.1, 4.2 and 4.3 as well as the thyristor 5 are shown only as representatives of a larger number of conductor tracks or active semiconductor elements, which are required for constructing a complete hybrid-integrated power semiconductor component. The component according to FIG. 6 can be enclosed by a housing which is not shown and from which, for example, the plug connectors 6 protrude. Finally, the component described is placed, by the metal layer 1, onto a cooling body 7 for cooling. The metal layer 1 here acts as an ideal heat sink which cannot only rapidly absorb the waste heat generated in the thyristor 5, but can also rapidly transmit it to the cooling body.

I claim:

1. A ceramic/metal element, in which a metal layer (1) is firmly bonded to a ceramic substrate (2) after cooling and consequent solidification of a previously liquid eutetic interlayer (3), wherein the metal layer (1) has at least approximately the same or a greater thickness(D) than the ceramic substrate (2) and is composed in the manner of a mosaic from individual, predominantly loosely adjoining metal elements (1.1).

2. The ceramic/metal element according to claim 1 wherein the metal is Cu or Al and the ceramic is $Al_2O_3$, BeO, AlN or SiC.

3. The ceramic/metal element according to claim 1, wherein the metal elements (1.1) are cuboid.

4. The ceramic/metal element according to claim 1, wherein the metal elements (1.1) are hexagonal rods.

5. The ceramic/metal element according to claim 1, wherein the interlayer (3) is a metal oxide layer of a metal which is identical to the metal of layer (1).

6. The ceramic/metal element according to claim 5, wherein the metal oxide of the interlayer is CuO.

7. The ceramic/metal element according to claim 1, wherein the greatest linear dimension (1) of the metal elements (1.1) in the layer plane of the metal layer (1) is smaller, or at least not substantially greater, than twice the thickness (D), of the metal layer (1).

8. The ceramic/metal element according to claim 7, wherein the greatest linear dimension (1) of the metal elements (1.1) in the layer plane of the metal layer (1) is equal to the single thickness (D) of the metal layer.

9. The ceramic/metal element according to claim 1, wherein the metal elements (1.1) are provided, on their mutual contact faces, with a coating (1.2) which does not form a eutectic at temperatures below the melting point of the metal.

10. The ceramic/metal element according to claim 9, wherein the Ni, Pd, Pt or Cr is used as the coating (1.2).

11. The ceramic/metal element according to claim 9, wherein the coating (1.2) is applied to the metal elements (1.1) by electroplating or by an electroless process.

12. The ceramic/metal element according to claim 1, wherein the ceramic substrate (2), on its side facing away from the first metal layer (1), is provided with conductor tracks (4.1, 4.2 and 4.3).

13. The ceramic/metal element according to claim 5 12, wherein an active semiconductor element (5) or a plug connector (6) or both is fitted to at least one of the conductor tracks (4.1, 4.2, and 4.3).

* * * * *